United States Patent [19]

Bolick, Jr.

[11] 4,247,876
[45] Jan. 27, 1981

[54] DICTATION RECORDING AND TRANSCRIBING SYSTEM UTILIZING A MULTIPLE MEDIA CARTRIDGE APPARATUS

[75] Inventor: Fred C. Bolick, Jr., Atlanta, Ga.

[73] Assignee: Lanier Business Products, Inc., Atlanta, Ga.

[21] Appl. No.: 970,357

[22] Filed: Dec. 18, 1978

[51] Int. Cl.³ .............................................. G11B 15/68
[52] U.S. Cl. ..................................................... 360/92
[58] Field of Search ......................................... 360/92

[56] References Cited

U.S. PATENT DOCUMENTS

| 3,589,733 | 6/1971 | Piotrowski | 360/92 |
| 4,164,765 | 8/1979 | Gysling | 360/92 |

Primary Examiner—Robert S. Tupper
Attorney, Agent, or Firm—Jones, Thomas & Askew

[57] ABSTRACT

A dictating and transcribing system includes a cartridge carrying a plurality of individual recording media, such as tape cassettes, and a means for selectively positioning the cartridge with respect to a record/listen transducer to place any one of the recording media in a recording position. Automatic access and re-access to any of the recording media may be obtained during dictation or transcription without manual handling of individual recording media. The cartridge is preferably rotatably driven about its center and slidably receives the recording media in locations radially disposed about the center of the cartridge.

5 Claims, 10 Drawing Figures

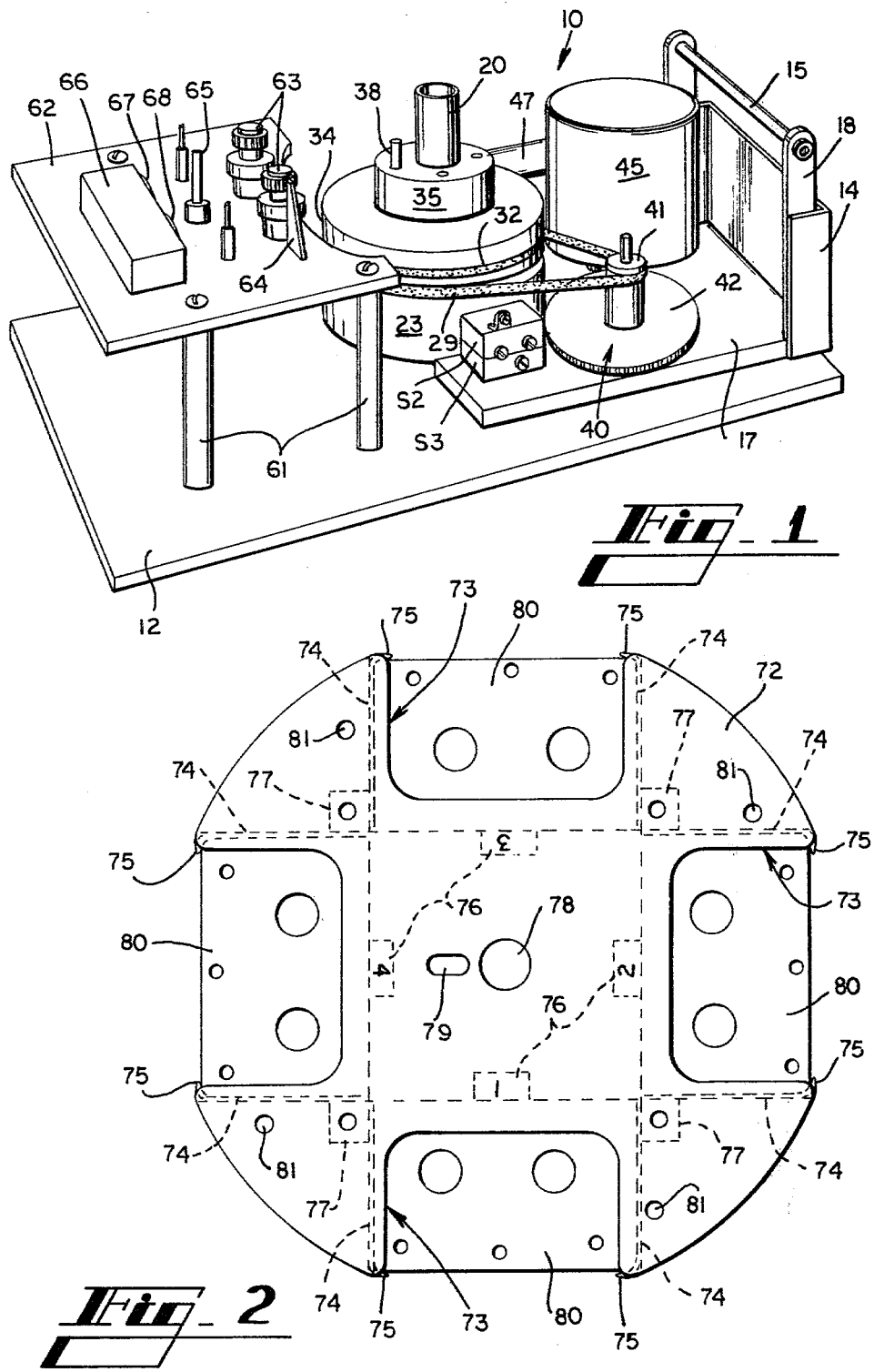

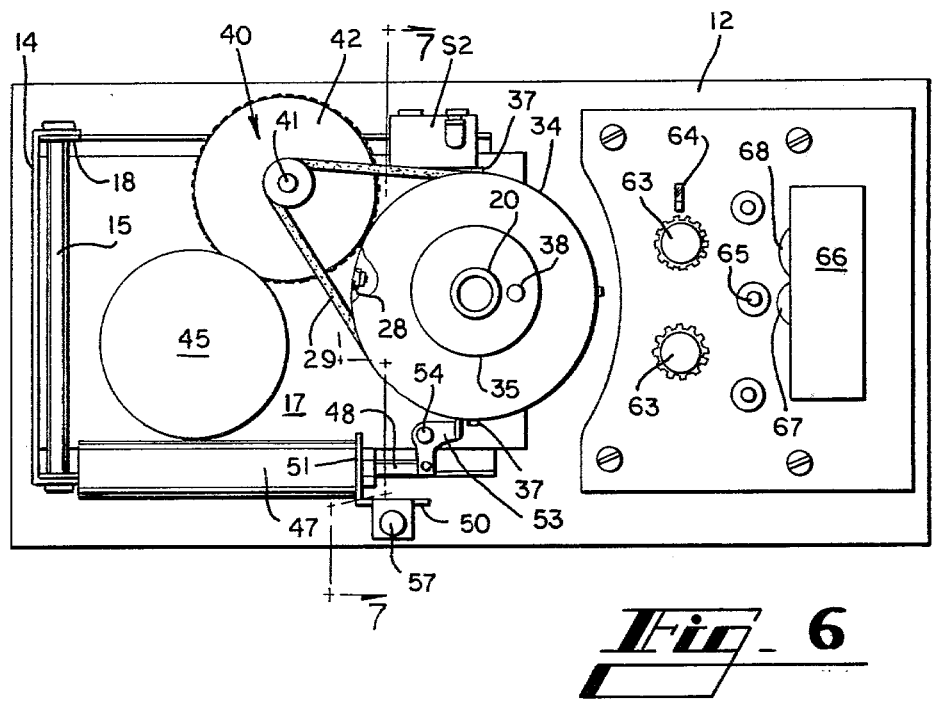
Fig. 6
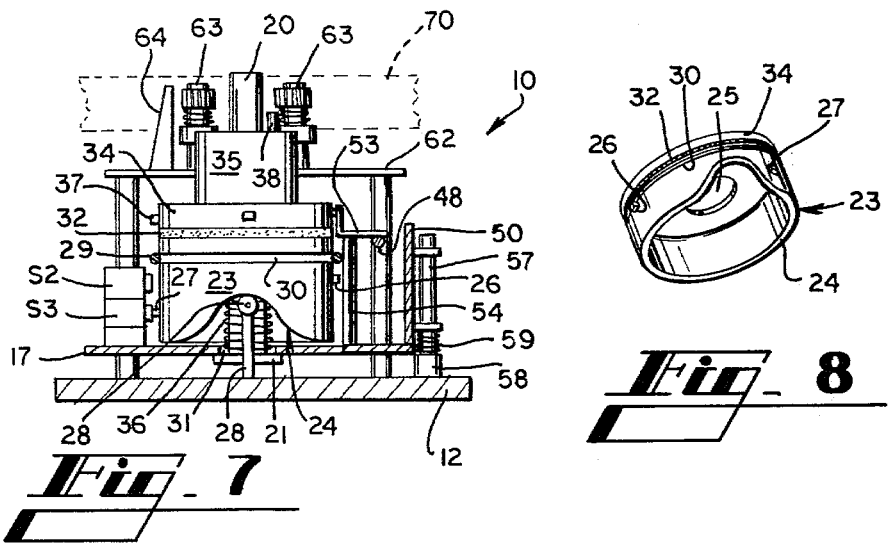
Fig. 7
Fig. 8
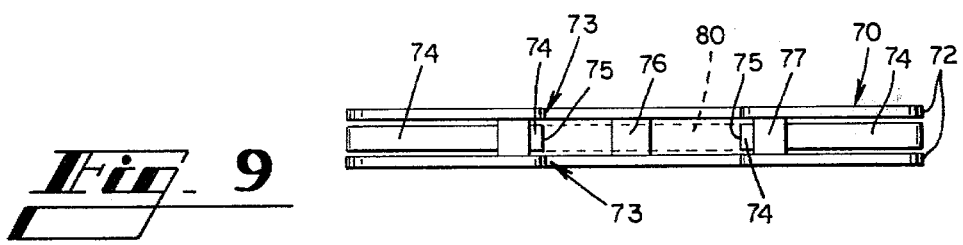
Fig. 9

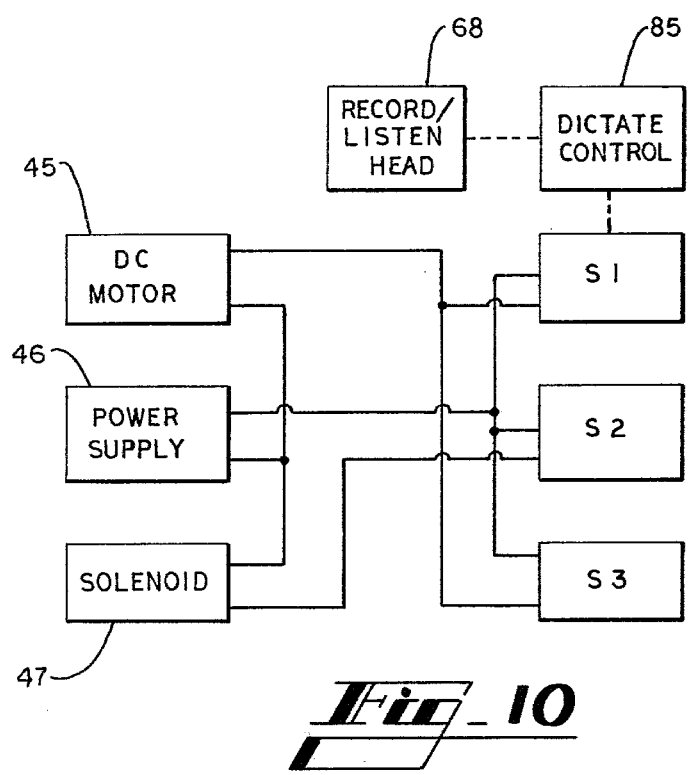
Fig_10

DICTATION RECORDING AND TRANSCRIBING SYSTEM UTILIZING A MULTIPLE MEDIA CARTRIDGE APPARATUS

TECHNICAL FIELD

This invention relates in general to message recording systems, and in particular to a system for recording and transcribing dictated messages in which said messages are recorded on discrete recording media such as tape cassettes.

BACKGROUND ART

Recent years have witnessed a significant growth in the popularity of dictation systems utilizing discrete recording media such as tape cassettes. The use of discrete media allows individual units of dictation to be recorded on separate media for individual access, for example, when a particular unit of dictation requires priority transcription. The advantage of individual access is particularly clear in comparison with prior art central dictation systems utilizing an endless loop of recording tape. In such systems, messages are recorded sequentially and can be transcribed out of order only if the transcribing person passes over the intervening material to reach the priority message and later rewinds the tape to transcribe the previously bypassed messages. This procedure may be considerably time-consuming and requires a special apparatus to prevent the bypassed messages from being inadvertently erased by subsequent message dictation before the bypassed messages are rewound for transcription.

The use of tape cassettes has a further advantage in that standard sizes such as the "C" size standard cassette or the "MC" microcassette, permit compatibility of the dictation system with other recording equipment such as portable dictation equipment and cassette tape recorders.

A significant problem with cassettes and other discrete media, however, is that the amount of dictation that can be recorded on a single cassette is limited. Thus, cassettes must be changed during dictation and a group of cassettes carrying a single long unit of dictation can become separated when transferred to a transcriber. Furthermore, no prior art dictation system has provided a capability for automatically providing access and reaccess to a number of cassettes, so that dictation can be recorded intermittently on each of several cassettes without manual handling of cassettes.

Standard sized tape cassettes have been utilized both in desk-top and central dictation/transcription systems. In one common form of desk-top system, both the dictating person and the transcribing person have similar desk-top units, each including a transducer head assembly for recording on or listening to a single tape cassette. Such a system requires a maximum of operator handling of individual tape cassettes. The cassettes must be carried from the dictating location to the transcribing location, and the dictating person must manually switch cassettes if it is desired to place an individual unit of dictation on a separate cassette. As work progresses, therefore, such a system generates a number of loose cassettes that must be catalogued and kept track of so that they are not lost and can be transcribed in the desired order.

The problem of handling individual cassettes becomes particularly acute for persons whose work requires intermittent attention to different types of work. For example, a person might need to dictate material related to several separate types of work each day, and further need to switch back and forth between types of work several times during the day. If dictation related to each type of work is to be recorded on an individual tape cassette, prior art dictation systems would require that the cassettes be manually switched in and out of the dictation apparatus. The dictating person would have to devote time and attention to organizing the loose tape cassettes so that they would be readily available the next time material was to be dictated related to particular types of work. Similarly, a person might have need of interrupting dictation to dictate a priority unit of dictation or to record a telephone call. Prior art dictation systems would again require handling and organizing of individual tape cassettes.

The prior art system shown in U.S. Pat. No. 4,113,994 utilizes a dual message recording and playback apparatus to reduce some of the manual delivery of tape cassettes between the dictating person and the transcribing person. A single unit located at the transcriber's desk contains two transport decks and associated record/listen transducers so that dictation may be recorded on one cassette while another is being transcribed. The dictating person has only a compact microphone and playback control. However, such an apparatus requires the dictating person to communicate with the transcribing person to manually provide a new tape cassette for dictation when such persons are simultaneously using the apparatus for dictation and transcription. Moreover, since a separate driving means and transducing means is required at each transport deck, considerations of size and cost place a limit upon the number of cassettes which can be made available without manual handling of cassettes.

Central cassette dictating apparatus, such as shown in U.S. Pat. No. 4,024,354, has provided apparatus for mechanically moving several individual tape cassettes into recording position in sequence. This allows the dictating person to move to a new tape cassette without handling cassettes, but restricts reaccess to cassettes containing previously recorded material. That is, it is impossible to intermittently accumulate dictation on a single cassette while also dictating on other cassettes. Thus, in order to provide for priority dictation and reaccess to partially completed dictation temporarily abandoned when the priority matter arose, it has been necessary to link two complete central dictation systems. Such a solution is not practical for a small office which cannot reasonably afford central dictation systems, but which requires a capability for priority dictation.

A further disadvantage of such prior art central cassette dictating systems is that the mechanical apparatus provided includes at least two expensive cassette changing mechanisms which move individual cassettes into and out of a recording position. In addition to being expensive, such mechanisms have tended to be unreliable since cassettes may become jammed while being removed from a pre-dictation storage location, carried and loaded onto a transport deck for recording, and then unloaded and carried to a post-dictation storage location.

SUMMARY OF THE INVENTION

The foregoing problems in prior art dictating and transcribing systems are solved by the present invention which allows a dictating or transcribing person immediate automatic selective access to any one of a plurality of individual recording media with the access being in any order and being repeated as often as it is desired to record or transcribe material on each of the individual recording media. The invention provides this improvement with cassettes carried in a cartridge that is manipulated to selectively place any of the recording media in the record/listen position. Generally described, the present invention comprises, in a dictation recording and/or transcribing system, a cartridge means for releasably retaining at least a first recording medium at a first location in the cartridge means and a second recording medium at a second location in the cartridge means, and a means for selectively positioning the cartridge means to place either the first location or the second location at a predetermined location which places a recording medium in the recording and/or transcribing position relative to a transducer for recording on or transcribing from the recording medium.

The cartridge means may carry a plurality of recording media, such as tape cassettes, and comprises a housing including a plurality of means for removably receiving the plurality of recording media at separate predetermined locations within the housing. The means for positioning the cartridge includes a single cartridge changing mechanism which transports the plurality of recording media simultaneously to place any one of the media at a particular location for recording or transcribing.

The housing of the cartridge means may be of a variety of shapes and may be manipulated in a variety of ways within the scope of the invention to place different recording media carried by the cartridge in the recording position. When the recording media are within cassettes of the type drivingly engaged by rotatable projections, such as spindles, associated with a transducer assembly, and such projections are inserted into openings in a cassette when dictation is recorded or transcribed, the cartridge and transducer assembly are moved relative to one another (1) substantially parallel to the axes of rotation of the projections, to withdraw the projections from the openings in the cassette, (2) generally perpendicular to the axes of rotation of the projections to align another cassette with the projections, and (3) again substantially parallel to the axes of rotation of the projections to insert the projections into the openings of the selected cassette. It is within the concept of the invention to provide such relative movement by moving only the cartridge, or only the transducer assembly, or by providing one direction of relative motion by movement of the cartridge and another direction of relative motion by movement of the transducer assembly.

Although the cartridge is removably mounted in the apparatus to permit a cartridge to be utilized in more than one apparatus, it is contemplated that it may be fixedly positioned with respect to the apparatus.

Preferably, the housing is rotatably driven about its center and slidably receives said recording media in positions radially disposed about the center of the housing equidistant therefrom in a single plane. Shifting between recording media may therefore be accomplished by raising the cartridge to lift a recording medium from the recording and/or transcribing position relative to the transducer, rotating the cartridge until another selected recording medium is positioned above the recording and/or transcribing position, and then lowering the cartridge to place the new recording media in the recording and/or transcribing position with respect to the transducer.

The system of the invention thus may provide random, intermittent access and reaccess to any of several recording media using a single, uncomplicated transport apparatus, and at the same time substantially overcomes the problems of excessive manual handling of recording media which accompanies the use of prior art systems. For example, a dictating person with a need for separation of various types of work may dictate on a separate tape cassette for each type of work and shift back and forth between types of work easily by operating the controls of the present system to move the cartridge to place the appropriate cassette in recording position. Likewise, if a dictating person needs to interrupt a unit of dictation to record a phone call or to dictate a priority unit of dictation, the person need only operate the cartridge mechanism to gain access to a fresh cassette, and thereafter to switch back to the cassette on which the original unit of dictation was being recorded. This may be accomplished without manual handling of the cassettes. Furthermore, the system provides for shifting between recording media without mechanically handling the individual recording media, since the media are temporarily fixed with respect to the cartridge during operation, and only the cartridge as a whole is shifted by the mechanical apparatus. Manual delivery between the dictating person and the transcribing person is also substantially reduced, since only cartridges containing a plurality of recording media need be delivered.

Thus, it is an object of the present invention to provide a dictating and transcribing system wherein individual recording media are carried by a cartridge and may be selectively positioned for recording and listening by mechanical manipulation of the cartridge rather than each individual recording medium.

It is a further object of the present invention to provide a dictating and transcribing system utilizing discrete recording media such as tape cassettes, and which minimizes manual handling of the recording media and eliminates separate mechanical handling of each individual medium.

It is a further object of the present invention to provide a dictating and transcribing system utilizing individual recording media and wherein reaccess to previously recorded media may be easily obtained without manual handling of the media or separate mechanical handling of each individual medium.

It is a further object of the invention to provide a dictating and transcribing system wherein standard tape cassettes are removably retained in a cartridge which simultaneously moves said cassettes to place one of said cassettes in a recording and/or transcribing position wherein a rotatable projection is inserted into an opening in said cassette.

It is a further object of the present invention to provide a cartridge removably carrying a plurality of recording media and adapted for movement relative to a transducer assembly in order to alternately place any of said recording media in a recording or playback position relative to the transducer assembly.

Other objects and advantages of the present invention will become more apparent from the following description of a disclosed embodiment of the invention, when taken in conjunction with the drawing and the appended claims.

BRIEF DESCRIPTION OF THE DRAWING

FIG. 1 is a pictorial view of a cassette changer apparatus according to the present invention.

FIG. 2 is a top plan view of a cartridge according to the invention, carrying four tape cassettes.

FIG. 6 is a top view of the cassette changer apparatus shown in FIG. 1.

FIG. 7 is a vertical cross sectional view of the cassette changer apparatus of the invention, taken along line 7—7 of FIG. 6.

FIG. 8 is a pictorial view of the cam, clutch and clutch-engaging member of the cassette changer apparatus.

FIG. 9 is a side view of the cartridge shown in FIG. 2.

FIG. 10 is a schematic diagram showing a circuit operative to control a cassette changer apparatus as shown in FIG. 1.

DETAILED DESCRIPTION

Figure 3:
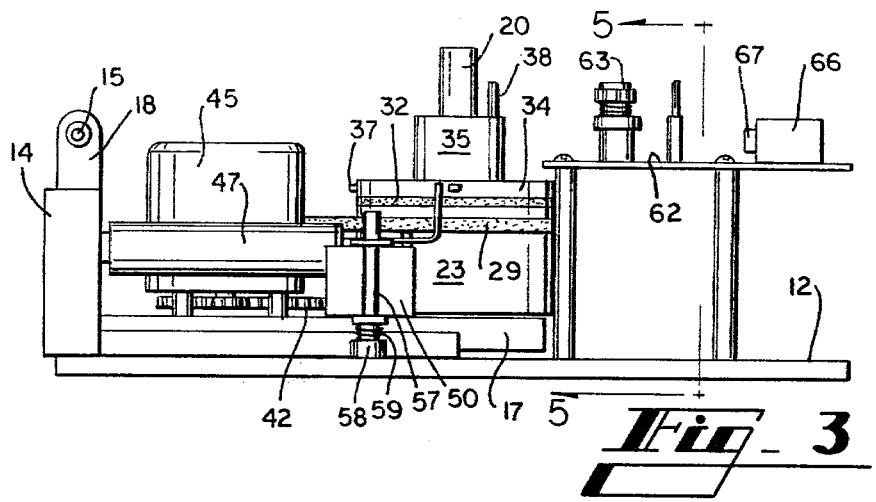
FIG. 3 is a left side view of the cassette changer apparatus shown in FIG. 1.

Referring now in more detail to the drawing, in which like numerals refer to like elements throughout the several views, FIG. 1 shows a cassette changer apparatus 10 according to the present invention. The changer apparatus 10 includes a rectangular base 12, across the width of which at one end thereof is mounted a pivot rod support member 14 carrying a pivot rod 15 elevated above the base 12. A movable L-shaped frame 17 is pivotally attached at one end thereof to the pivot rod 15 by a pair of pivots 18. Thus, the branch of the "L" attached to the pivot rod 15 is disposed generally vertically, and the other branch extends generally horizontally over the base 12. Near the end of the horizontal portion of the frame 17 a generally vertical shaft 20 is fixed to the frame 17 by a shaft nut 21, as shown in FIG. 7.

A cam 23, shown in FIGS. 1, 3–5, 7 and 8, is rotatably mounted on the vertical shaft 20. The cam has the shape of a short cylinder with its upper end enclosed, as shown in FIG. 8. The shaft 20 passes through a shaft-engaging opening 25 in the enclosed upper end of the cam 23, and a cam surface 24 is defined by the edge of the cylinder at its open end. The length of the cylinder varies so that for one-half of its circumference, the cam surface 24 remains a fixed distance from the enclosed end of the cam cylinder. Along the other half of the circumference of the cam, the cam surface 24 dips toward the enclosed upper end of the cam cylinder. A cam follower 28 is mounted on the base 12 and extends through an opening 31 in the movable frame 17 to engage the cam surface 24, as shown in FIG. 7. As the cam rotates, the cam 23 and cam follower 28 lift the frame 17 from a lowered position (shown in FIGS. 3 and 7) to a raised position (shown in FIG. 4).

The cam 23 also includes an upper cam trip 26 and a lower cam trip 27 projecting from the cylindrical surface of the cam. An upper cam limit switch S2, mounted adjacent to the cam on the frame 17, is engaged by the trip 26, and a lower cam limit switch S3, similarly located, is engaged by the trip 27. The switch S2 is closed when depressed, and the switch S3 is closed when released. The cam 23 also includes a cam belt groove 30 about the circumference of the cam, the groove 30 receiving a cam belt 29 to drive the cam 23 in a clockwise direction.

Also mounted on the vertical shaft 20 immediately above the cam 23, are a clutch 32, a clutch-engaging member 34, and a cartridge support member 35. The clutch-engaging member and the cartridge support member are fixed to one another and are together rotatably mounted on the shaft 20. A clutch biasing spring 36 biases the cam 23 against the clutch-engaging member 34. Thus, when the cam 23 is rotated about the shaft 20, the cartridge support member 35 tends to rotate with the cam. The cartridge support member 35 includes a vertically extending cartridge locator key 38 to properly position a cartridge 70 placed on the cartridge support member 35 and to carry the cartridge with the support member 35 as it rotates. The clutch-engaging member 35 includes four cartridge motion stops 37 extending from the circumference of the clutch-engaging member 34 spaced at equal intervals 90° apart around the clutch-engaging member 34.

A cam drive pulley 40 is rotatably mounted on the frame 17 next to the cam 23. A small diameter upper member 41 of the pulley 40 carries the cam belt 29. A larger diameter lower member 42 of the pulley 40 forms a gear which is driven by a DC motor 45. The DC motor 45 may alternately drive the pulley 40 by means of a belt similar to the belt 29. The DC motor 45 is operated by a power supply 46 (shown diagramatically in FIG. 10).

A solenoid 47, shown in FIGS. 3 and 6, is mounted along the side of the frame 17 opposite the cam drive pulley 40. The solenoid 47 is held by a collar 51 mounted on a vertical support bracket 50 that is fixed to the frame 17. A piston rod 48 extends from the solenoid 47 alongside the cam 23. A pivot link 53 is pivotally mounted both to the end of the piston rod 48 and to a vertical pivot support axle 54 mounted on the frame 17 between the end of the piston rod 48 and the circumference of the clutch-engaging member 34. Prior to energizing the solenoid 47, the piston rod 48 is in an extended position wherein the pivot link 53 rests against the circumference of the clutch-engaging member 34 and therefore engages one of the cartridge motion stops 37 to prevent the cartridge support member 35 from rotating with the cam 23. When the solenoid 47 is energized, the piston rod 48 is withdrawn into the solenoid 47, thereby pivoting the pivot link 53 about the pivot support axle 54 to move the pivot link 53 away from the clutch-engaging member 34, allowing the clutch-engaging member 34 and the cartridge support member 35 to rotate with the cam 23.

In an alternate embodiment of the invention (not shown) the pivot link 53 is removed from the path of the stops 37 by a mechanical means other than the solenoid 47. In such alternate embodiment, the pivot link 53 is fixed to a finger located in the path of the lower cam trip 27, and both the finger and the pivot link are spring biased to urge the pivot link against the clutch-engaging member 34. The finger is located such that at the time the solenoid switch S2 would have been activated, the lower cam trip 27 hits the finger and rotates the finger-pivot link assembly about the axle 54 to momentarily remove the pivot link from the path of the stop 37, allow the clutch-engaging member 34 to rotate. After the trip 27 passes the finger, the pivot link 53 is again biased against the member 34 to arrest motion of the member 34 when the next stop 37 engages the pivot link 53. It will be understood that in the absence of the solenoid 47, neither the switch S2 nor the upper cam trip 26 would be required.

In order to ease the descent of the frame 17 from a raised to a lowered position as the cam 23 rotates, a dash pot 57 having the foot 58 extending therefrom and biased outwardly by a spring 59, is mounted on the vertical support bracket 50 outwardly of the frame 17. As the frame 17 is lowered by the cam, the foot 58 engages the base 12 and eases the frame 17 into a lowered position.

Mounted to the base 12 beyond the end of the horizontal portion of the frame 17 is a tape transport deck 62 supported on a plurality of transport deck support legs 61. The tape transport deck 62 carries a tape transport mechanism well-known to those skilled in the art. The mechanism includes rotatable projections for driving cassettes, namely, a pair of spindles 63, and a capstan 65. The deck 62 also includes a tapered locator key 64 for engaging a cartridge 70 and guiding it into proper position with respect to the transport mechanism. The deck 62 also carries a movable transducer head assembly 66 which includes a pinch roller 67 for engaging the capstan 65 and a record/listen head 68. A means (not shown) is provided for slidably moving the transducer head assembly 66 into and out of engagement with a tape cassette placed in a recording position on the tape transport deck 62, in a manner known to those skilled in the art.

In the system of the present invention, individual recording media are carried by a cartridge 70, as shown in FIGS. 2 and 9. The cartridge 70 includes a pair of retaining members in the form of parallel plates 72, each including a plurality of cutouts 73, radially disposed about the center of the cartridge 70. Disposed between the parallel plates 72 at either side of each cutout 73 are a pair of flexible guides 74. The guides 74 are spaced apart approximately the length of a standard microcassette. The inner ends of the guides 74 are attached to blocks 77 which serve to attach the parallel plates 72 to one another and to support the guides 74. The guides 74 each include a small projection 75 extending toward the cutouts 73. A rear stop 76 is located inwardly of each cutout 73 approximately the width of a standard microcassette from the projections 75 on the flexible guides 74. Thus, a standard microcassette may be slidably inserted between the parallel plates 72 and between a pair of flexible guides 74 until the cassette meets a rear stop 76. The flexible guides 74 are biased against the sides of the microcassette, and therefore the projections 75 on the guides 74 removably retain the microcassette within the cartridge 70 at a fixed location. Alternately, one of each pair of guides 74 may be rigid and the other guide flexible, so that the guides will still press against the sides of the microcassette, but the microcassette will be more accurately positioned within the cartridge than when both guides are flexible. The cutouts 73 are somewhat smaller in area than the cassettes, so that the parallel plates 72 restrain the cassettes, but the openings in cassettes are exposed for insertion of the rotatable spindles 63 and capstan 65 of the transport mechanism and the cassettes may still be grasped at the location of the cutouts 73 for insertion and removal.

Figure 4:
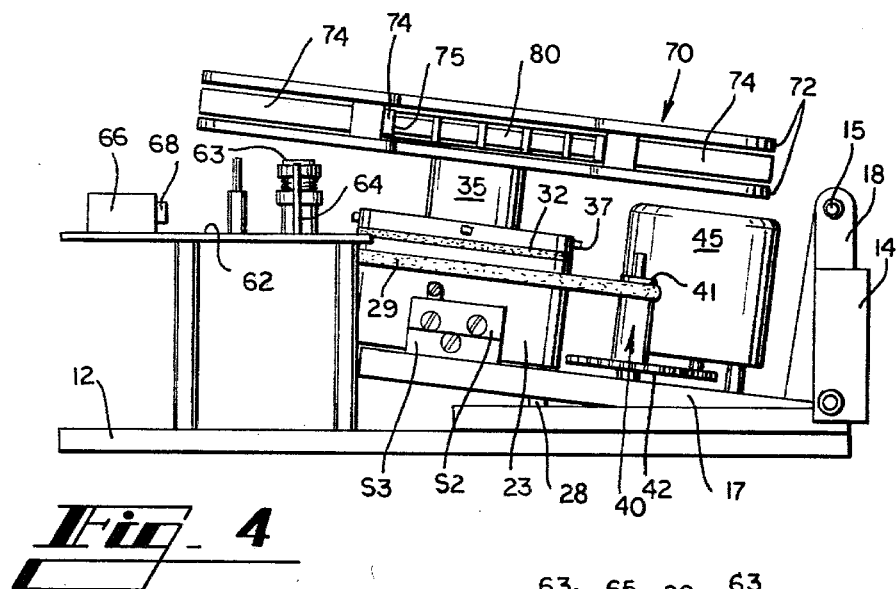
FIG. 4 is a right side view of the cassette changer apparatus shown in FIG. 1, showing a cassette cartridge mounted on the apparatus in a raised position.
Figure 5:
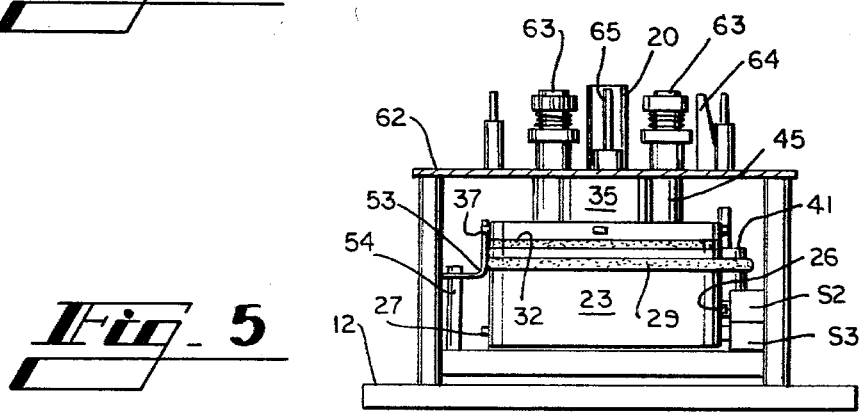
FIG. 5 is an end cross-sectional view of the cassette changer apparatus taken along line 5—5 of FIG. 3.

The cartridge 70 also includes a shaft opening 78 at the center thereof so that the cartridge 70 may be placed over the vertical shaft 20 and come to rest upon the cartridge support member 35, as shown in FIG. 4. A keyway 79 is provided to receive the cartridge locator key 38 on the cartridge support member 35. Furthermore, a positive locator keyway 81 is located adjacent each cassette position in the cartridge 70. Each locator keyway 81 receives the locator key 64 mounted on the transport deck 62 when the cartridge 70 is lowered onto the tape transport deck 62 with the associated cassette location positioned over the deck 62. The tapered nature of the locator key 64 guides the cartridge 70 into precise alignment with the transport deck 62, rather than relying on the dead stop of the cartridge motion stops 37 against the pivot link 53.

Position indicia in the form of numerals 1, 2, 3, 4 are inscribed on the upper one of the plates 72 behind each cassette location, so that the operator of the apparatus may visually determine which cassette is in position on the transport deck 62. If a cabinet (not shown) is supplied to enclose the apparatus, a window may be provided to allow such indicia to be seen.

FIG. 10 shows a schematic diagram of the electrical circuitry utilized to operate the cassette changer apparatus of the present invention. One lead of the DC motor 45 is connected to one lead of the power supply 46 and one lead of the solenoid 47. A shift initiator switch S1 is operated by a dictate control 85. One lead of the switch S1 is connected to one lead of the upper cam switch S2 and one lead of the lower cam switch S3, and these leads are connected to the other lead of the power supply 46. The other lead of the shift initiator switch S1 is connected to the other lead of the lower cam switch S3 and the other lead of the DC motor 45. The other lead of the upper cam switch S2 is connected to the other lead of the solenoid 47. The dictate control 85 operates the record/listen head 68 in various modes known to those skilled in the art in order to advance and rewind the tape of a tape cassette, to record dictated messages on the tape, and to listen to material previously recorded. It is also contemplated that the dictate control 85 will include means for causing the record/listen head 68 to record indexing signals on the tape 68 in a manner similar to that disclosed in U.S. Pat. No. 4,024,354, and to display indexing information. Such an indexing and display system could replace the visual indicia on the cartridge described above.

In operation, a cartridge 70 is placed over the vertical shaft 20 into position on the cartridge support member 35, and properly located by fitting the keyway 79 over the cartridge locator key 38. Since, when the system is at rest, one of the stops 37 is contacting the pivot link 53, placement of the cartridge 70 in such a manner will also position one of the tape cassettes 80 in a recording position on the transport deck 62, with the reels within openings of the tape cassette 80 engaging the spindles 63. Furthermore, the positive locator keyway 81 associated with the cassette in the recording position will slidably engage the positive locator key 64 and thereby guide the cartridge 70 into a precise location with respect to the transport deck 62.

The dictating person may now utilize the dictate control 85 to record units of dictation on the tape cassette 80 in the recording position by bringing the transducer head assembly 66 into position against the cassette 80. As is traditionally the case, the dictate control 85 is then used to move the tape by driving it between the pinch roller 67 and the capstan 65, and by energizing the record head 68 to record a dictated message on the tape within the tape cassette 80. Commonly, the dictate control 85 also provides capabilities for listening to previously recorded messages, for recording instructions regarding recorded messages, and for recording various indexing signals, as described, for example, in U.S. Pat. No. 4,007,491.

When the full length of the tape within the cassette 80 has been utilized, or whenever the dictating person desires to interrupt dictation on a tape cassette in the recording position and switch to another of the cassettes 80 within the cartridge 70, he or she need only depress a switch on the dictate control 85 to activate shift initiator switch S1. The depression of switch S1 momentarily connects the power supply 46 to the DC motor 45, initiating rotation of the cam drive pulley 40 and the cam 23. The lower cam trip 27, which depresses the lower cam switch S3 when the system is at rest, is rotated away from switch S3, thereby releasing it. Since the switch S3 is closed when released, the DC motor 45 remains energized, and the cam 23 continues to rotate in a clockwise direction. The cam follower 28 follows the cam surface 24 and immediately leaves the indentation in the cam surface 24 which has placed the cam and the frame 17 in its lowered position when at rest. Thus, the cam begins to rise and causes the frame 17 to pivot about the pivot rod 15, and to lift the cartridge 70 above the recording position clear of the spindles 63, the capstan 65 and the key 64.

During the initial rotation of the cam 23, while the cam is lifting the cartridge 70 clear of the transport deck apparatus, the cartridge motion stop 37 biased against the pivot link 53 prevents rotation of the clutch-engaging member 34, the cartridge support member 35, and the cartridge 70. However, when the cam 23 has rotated approximately 180°, the upper cam trip 26 passes by and depresses the upper cam switch S2. As will be seen in FIG. 10, the depression of the switch S2 energizes the solenoid 47 to withdraw the piston rod 48 and remove the pivot link 53 from the path of the stop 37. The cartridge 70 is thus allowed to rotate with the cam 23 since nothing prevents the clutch 32 from driving the clutch-engaging member 34.

Since the upper cam trip 26 rotates on past the switch S2, the energization of the solenoid 47 is only momentary and the pivot link 53 immediately moves back into position against the circumference of the clutch-engaging member 34. Thus, after a rotation of 90°, the next stop 37 engages the pivot link 53 and once again prevents rotational motion of the cartridge 70. At this point, however, the next successive tape cassette 80 mounted in the cartridge 70 has reached a position directly above the recording position. It will be noted also that the cam 23 is designed so that the rotational movement of the cartridge 70 has occurred entirely while the cam has held the frame 17 in the raised position. Immediately after the rotational movement of the cartridge 70 has been completed, the cam surface 24 begins to lower the frame 17 to its lowered position, lowering the cartridge 70 with the next adjacent cassette 80 now in the recording position on the transport deck 62. The vertical movement of the cartridge inserts the spindles 63 and capstan 65 into the proper openings in the cassette 80. As the cam 23 completes one full revolution, the lower cam trip 27 again depresses the lower cam switch S3, breaking the connection between the power supply 46 and the DC motor 45 and causing the apparatus to again come to rest. Now the dictate control 85 may be utilized to record dictated messages on the cassette 80 newly placed in the recording position.

If, however, the dictating person does not wish to record on the next adjacent tape cassette 80, but wishes to gain access to one of the other cassettes 80 mounted in the cartridge 70, the dictating person need only once again activate the shift initiator switch S1 to cause the apparatus to shift the cartridge 70 another 90° to place the next adjacent cassette 80 in the recording position. Thus, the dictating person may rotate the cartridge 70 automatically and repeatedly as desired, to gain access to the plurality of cassettes mounted in the cartridge 70 and to easily return to a cassette upon which the dictating person previously recorded. Of course, the tape within any cassette to which the dictating person returns will be found in precisely the same position as it was when dictation on that cassette was interrupted.

Given the novel concept of the present invention as disclosed herein, it would be within the skill of the art to provide additional means to permit reverse rotational motion of the cartridge 70, or to skip over cassette locations in the cartridge without lowering them into the recording position, in order to provide quicker access to various cassettes in the cartridge.

It will be understood that the transcribing person may place a cartridge 70 carrying cassettes having dictation recorded thereon in a similar cassette changer apparatus 10 and experience the same convenience and flexibility in transcribing the dictation recorded on the cassettes as the dictating person experienced in recording the dictation on the cassettes. In many instances, it would never be necessary to handle an individual cassette, it being sufficient to handle cartridges 70 containing many individual cassettes 80. However, if it is necessary, for example, to transcribe dictation recorded on a cassette by a remote portable dictating machine, a cassette may easily be removed from the cartridge 70 by grasping it at the location of the cutouts 73 and pulling it out against the inward pressure of the flexible guides 74. The remotely recorded cassette may also be easily slid into the slot and removably maintained in position by the flexible guide 74 and the projections 75 at the ends thereof.

The cassette changer apparatus 10 disclosed herein may also include a means (not shown) for stopping the rotational motion of the cam 23 when the frame 17 is in its raised position. This would provide an "eject" position that would make it more easy to remove or insert the cartridge 70 on the cartridge support member 35. A suitable control circuit for causing the frame 17 to assume an eject position would be included in the dictate control 85. Further circuitry could be included in the dictate control 85 to cause the cartridge 70 to be shifted to a particular orientation whenever the cartridge was moved from the eject or loading position to an operating position. The placement of a particular cassette location in the recording position at the beginning of operation would provide a convenient reference for an indexing system utilized in connection with the cassette changer apparatus 10.

It will further be understood that although the preferred embodiment disclosed herein includes a mechanism for rotatably shifting a cartridge 70 containing radially disposed cassettes, other cartridge orientations and means of shifting are within the concept of the present invention. Any mechanism, for example, that changes cassettes by relative motion of the cartridge and the rotatable projections of the transducer assembly, including motion parallel to the axes of rotation of the projections to withdraw the projections from one cassette, motion generally perpendicular to the axes of the projections to align another cassette with the projections, and motion again parallel to the axes of the projections to insert the projections into the openings of the newly aligned cassette is within the concept of the invention. For example, the cassettes 80 could be disposed linearly along a cartridge, and shifting between cassettes could be accomplished by longitudinal movement of the cartridge with respect to a transducer head assembly. The means for shifting between cassettes could also raise the cartridge to place a cassette in the recording position and lower the cartridge during movement thereof, if the recording medium being utilized required vertical movement with respect to rotatable driving projections. Alternately, the transducer assembly itself and the transport deck could be moved relative to the cartridge to provide either one or both of the required motions.

Furthermore, the concept of the present invention is intended to encompass any form of discrete recording media, a plurality of which may be mounted in a cartridge, such as discs.

While this invention has been described in detail with particular reference to a preferred embodiment thereof, it will be understood that variations and modifications can be effected within the spirit and the scope of the invention as described hereinbefore and as defined in the appended claims.

I claim:

1. In a dictation recording system,
a removable cartridge means for carrying a first recording medium and a second recording medium, said cartridge means comprising a housing including a central drive member engaging means and a first and second means radially disposed about said central drive member engaging means equidistant therefrom in a single plane for slidably receiving said first and second recording media;
a means for selectively positioning said cartridge means to place either said first recording medium or said second recording medium in a recording position relative to a transducer for recording on said one of said recording media in said recording position; said cartridge positioning means comprising:
a drive member mounted on a frame for rotation about a vertical axis, engaging said housing at the center thereof;
a cam rotatably mounted coaxially with and beneath said drive member and separated therefrom by a clutch, said cam having a cam surface defined by the edge of a cylinder of varying length about the circumference thereof;
a cam follower mounted on a base beneath said cam and passing through an opening in said frame to engage said cam surface;
a means for rotating said cam;
a brake means for preventing rotation of said drive member when one of said recording media is in said recording position; and
a means for releasing said brake means to allow said drive member and cartridge to rotate with said cam until said other of said recording media is in said recording position, said cam lifting said frame and said cartridge to raise said medium out of engagement with said transducer means, and said brake means being released only when said cartridge is raised by said cam.

2. The system of claim 1, wherein said recording media are tape cassettes and wherein each of said means for slidably receiving said tape cassettes comprises a slot defined by a pair of parallel plates separated by a distance slightly greater than the thickness of said cassettes, a pair of guides between said plates, said guides separated by approximately the length of said cassettes, each guide including a projection at one end thereof extending a short distance toward the other guide and at least one of said guides being biased toward said other guide, and a stop located between said plates and between said guides at the ends of said guides not including said projections, whereby said cassettes may be slidably inserted into said slot to a position between said plates, said guides, said stop, and said projections wherein said cassettes are removably held.

3. In a system for recording and transcribing dictated messages including at least two record/playback units, each of which record/playback units includes a record/listen transducer for recording dictation on a recording medium placed in a recording position with respect to said record/listen transducer,
a cartridge carrying a plurality of said recording media, said cartridge being removably received by any of said record/playback units, and said recording media being releasably held in fixed positions with respect to said cartridge throughout operation of said record/playback units; and
a means associated with each of said record/playback units for selectively positioning said cartridge to place any one of said recording media carried by said cartridge in said recording position, said means for selectively positioning said cartridge including
a longitudinally extending main frame;
a longitudinally extending subframe pivotally mounted to said main frame at one end thereof;
a cam including a circular cam surface rotatably mounted to said subframe at the end of said subframe opposite said pivotal mounting of said subframe to said main frame; said cartridge engaging said cam through a slip clutch for intermittent rotatable movement with said cam;
a cam follower mounted on said main frame and extending through an opening in said subframe to engage said cam surface;
a means for rotating said cam, said cam surface being adapted to raise said subframe, hold said subframe in a raised position, and lower said subframe in one revolution of said cam;
a brake means for preventing rotation of said cartridge with said cam during raising and lowering of said subframe; and
a means for releasing said braking means while said subframe is held in a raised position to allow said cartridge to rotate with said cam,
whereby dictated messages may be recorded on a plurality of recording media using one of said record/playback units and transcribed using another of said record/playback units, by moving said cartridge from one record/playback unit to the other, all without manual or mechanical handling of individual recording media.

4. The system of claim 3 wherein each of said record/playback units includes a position indicating means for displaying a visible indicator associated with each recording medium position of said cartridge, said position indicating means being responsive to a particular recording medium position being in said recording position to display said visible indicator associated with said particular recording medium position.

5. In a dictation recording system,
a cartridge means for carrying a first recording medium and a second recording medium; and
a means for selectively positioning said cartridge means to place either said first recording medium or said second recording medium in a recording position relative to a transducer for recording on said one of said recording media in said recording position; said cartridge positioning means comprising:
a drive member mounted on a frame for rotation about a vertical axis, engaging said cartridge at the center thereof;
a cam rotatably mounted coaxially with and beneath said drive member and separated therefrom by a clutch, said cam having a cam surface defined by the edge of a cylinder of varying length about the circumference thereof;
a cam follower mounted on a base beneath said cam and passing through an opening in said frame to engage said cam surface;
a means for rotating said cam;
a brake means for preventing rotation of said drive member when one of said recording media is in said recording position; and
a means for releasing said brake means to allow said drive member and cartridge to rotate with said cam until said other of said recording media is in said recording position, said cam lifting said frame and said cartridge to raise said medium out of engagement with said transducer means, and said brake means being released only when said cartridge is raised by said cam.

* * * * *